US006456498B1

(12) United States Patent
Larson et al.

(10) Patent No.: US 6,456,498 B1
(45) Date of Patent: Sep. 24, 2002

(54) COMPACTPCI-BASED COMPUTER SYSTEM WITH MID-PLANE CONNECTOR FOR EQUIVALENT FRONT AND BACK LOADING

(75) Inventors: Thane M. Larson; Kirk Bresniker, both of Roseville, CA (US)

(73) Assignee: Hewlett-Packard Co., Palo Alto, CA (US)

(*) Notice: Subject to any disclaimer, the term of this patent is extended or adjusted under 35 U.S.C. 154(b) by 0 days.

(21) Appl. No.: 09/923,945

(22) Filed: Aug. 7, 2001

(51) Int. Cl.[7] ............................ H05K 5/00; H05K 7/14; H05K 1/11

(52) U.S. Cl. ....................... 361/752; 361/756; 361/726; 361/788; 174/262

(58) Field of Search ................................ 361/752, 756, 361/801, 802, 726, 727, 753, 788, 796, 797, 741, 829, 681–685, 679; 174/250–268; 710/8, 62, 72, 28, 63, 104; 714/10–13, 43, 56; 312/223.1–223.4

(56) References Cited

U.S. PATENT DOCUMENTS 5,544,006 A 8/1996 Radloff et al.
5,809,262 A 9/1998 Potter
5,812,797 A * 9/1998 Crane, Jr. ................... 395/306
6,046,912 A 4/2000 Leman
6,058,011 A 5/2000 Hardt et al.
6,112,271 A 8/2000 Lanus et al.
6,129,557 A * 10/2000 Blaszczyk .................... 439/61
6,129,591 A 10/2000 Czeschka
6,138,247 A 10/2000 McKay et al.
6,161,197 A 12/2000 Lanus et al.
6,162,073 A 12/2000 Haq et al.
6,166,902 A 12/2000 Liu et al.
6,185,093 B1 2/2001 Moss
6,185,110 B1 2/2001 Liu
6,195,262 B1 2/2001 Bodette et al.
6,198,633 B1 3/2001 Lehman et al.
6,209,051 B1 3/2001 Hill et al.
6,237,048 B1 5/2001 Allen et al.
6,260,155 B1 * 7/2001 Dellacona ...................... 714/4

* cited by examiner

*Primary Examiner*—David S. Martin
*Assistant Examiner*—Michael L. Lindinger

(57) ABSTRACT

A CompactPCI-based computer system including a chassis and a mid-plane board. The mid-plane board forms bus circuitry, and is positioned between a front and back of the chassis. The chassis and the mid-plane board combine to define a plurality of CompactPCI form factor slots, including front slots and back slots. At least one of the front slots and at least one of the back slots are system slots configured to receive and provide independent bus connections for respective CompactPCI form factor system processor cards. In one preferred embodiment, the mid-plane board is configured to provide a bussed connector at a first front slot and at a second back slot, and a transition connection at a first back slot and a second front slot. With this one preferred embodiment, a one- or two-unit wide system processor card can be loaded into the first front slot, and another one- or two-unit wide system processor card can be loaded into the second back slot.

20 Claims, 6 Drawing Sheets

COMPACTPCI-BASED COMPUTER SYSTEM WITH MID-PLANE CONNECTOR FOR EQUIVALENT FRONT AND BACK LOADING

BACKGROUND OF THE INVENTION

The present invention relates to a PCI-based computer system incorporating a mid-plane connector board. More particularly, it relates to a computer system including a chassis and mid-plane connector board configured to load and operate CompactPCI form factor system processor cards at both front and back sides thereof.

Peripheral component interconnect (PCI) bus architecture is widely used for a variety of different computer systems, ranging from desktop or notebook personal computers, to industrial-type computer systems, such as network servers. In this regard, industrial and/or embedded computer systems require a more robust mechanical form factor as compared to desktop-type applications, due to the harsh environment in which these systems are normally operated, and the high performance application requirements. To this end, a consortium known as the PCI Industrial Computer Manufacturers Group (PICMG®) has promulgated the CompactPCI® specification that uses industry standard mechanical component and high performance connector technologies to provide an optimized system intended for rugged applications. The CompactPCI specifications are described in *CompactPCI specification*, by PICMG, 301 Edgewater Place, Suite 500, Wakefield, Mass. and is available at www.picmg.org. PICMG and CompactPCI are registered trademarks of the PCI Industrial Computer Manufacturers Group.

In addition to prescribing a variety of bus and software parameters, the CompactPCI specification defines a form factor for boards or cards insertable and operational with a CompactPCI acceptable computer system. As a point of reference, a CompactPCI computer system generally includes an outer chassis and a backplane board (or simply a "backplane") forming various connectors and bus circuitry. Of course, a number of other components are also provided, such as power supply unit, hard disk drive, cooling fan, etc. Nonetheless, the chassis and the backplane combine to define a series of slots into which the auxiliary PCI cards are inserted. The PCI cards, or more particularly CompactPCI form factor cards, widely vary in terms of configuration and function, ranging from system processor cards to peripheral or I/O cards, such as digital control cards, relay control cards, etc.

With the above in mind, the CompactPCI card form factor includes 3U cards (100 mm×160 mm) and 6U cards (233.35 mm×160 mm). In addition, the maximum unit width (or thickness) of the CompactPCI form factor card (and related components disposed thereon), and thus of each slot defined by the chassis and backplane, is established as 20.32 mm (or card center-to-center spacing). This width is oftentimes referred to as a CompactPCI unit width, or simply a "unit width".

In light of the above-described CompactPCI form factor requirements, the "standard" CompactPCI chassis design defines a front panel or side and a back panel or side. The backplane is oriented parallel with the front and back panels, thereby establishing a front region and a back region. Further, the backplane is normally positioned more closely to the back panel. Due to this offset location, the front region is much deeper than the back region. For example, the typical CompactPCI chassis/backplane configuration provides the front region with a depth of approximately 8 inches and the back region with a depth of approximately 4 inches.

Thus, the front region of a standard CompactPCI computer system chassis is configured to load and operate the various CompactPCI cards, whereas the back region can only serve as a transition zone for receiving one or more transition modules related to the card inserted at the corresponding front side slot. More particularly, the backplane forms a feedthrough connector at one or two of the defined front slots. A card, and in particular a system processor card, inserted into that front slot is connected to the feedthrough connector (along with a system processor bus connector). An auxiliary card, otherwise related to the system processor card, can then be inserted into the corresponding back same slot, and is connected to the front slot card via the feedthrough connector. Effectively, then, the offset positioning of the backplane facilitates the provision of extended capabilities for a card that is inserted into a corresponding front slot.

The above-described "standard" CompactPCI chassis/backplane design is universally accepted and quite viable. However, this design limits the number of system processor cards usable with the computer system. In particular, the chassis/backplane load provides CompactPCI form factor slots at the front; including normally one or two system processor card slots, with the remaining slots being reserved for peripheral or I/O cards. If a normal, CompactPCI system were to be fully loaded with processor cards, the processor cards must be limited to occupy only a single unit width slot; or alternatively, the system would sacrifice usable slots to cards that are wider than a single unit width slot. The limited size of the back region, along with the bus architecture and feedthrough connector form of the backplane, prevents loading of system processor cards in the back slots, in turn limiting the overall capabilities of the computer system.

An additional concern associated with the standard CompactPCI chassis design is an inability to service the computer system from either the front or the back. In this regard, one common application for industrial computer systems is in the telecommunications industry, which restricts loading/servicing to the front side only. More recently, however, as CompactPCI chassis designs move into the ISx markets (that typically utilize deeper racks), dual side loading/servicing has become desirable. Due to the extremely large number of functions and processed data associated with telecommunications activities, a large number of computer systems must be employed in tandem. The common practice is to mount a series of computer systems in a component rack. A number of these racks are then stored side-by-side in a centralized location. Servicing of any one particular computer system at the front side is relatively straightforward, as the operator is able to identify the computer system in question. Unfortunately, servicing of a component via the back side of that same computer system by a single technician can be cumbersome as it is difficult to identify the proper computer system from a plurality of racked components. As a result, two operators are required; one standing at the front side, and the other standing at the back side. In this way, the front side operator can confirm that the back side operator has properly located the computer system in question.

In addition, an operator standing at the back side of the computer system has no way to control or otherwise access functioning of the front slots (and associated cards), and vice-versa. Conversely, an operator servicing the computer system from either the front side or the back side is unable to prevent another operator from unknowingly interrupting a particular service operation from an opposite side of the computer system. Thus, a technician standing at the back side may unintentionally override servicing efforts of another technician working at the front side, and vice-versa.

CompactPCI computer systems continue to be highly popular. However, opportunities for improved capabilities and servicing remain. Therefore, a need exists for a CompactPCI-based computer system configured to receive and operate multiple system processor cards, and/or facilitate servicing thereof, from either the front or back.

SUMMARY OF THE INVENTION

One aspect of the present invention relates to a CompactPCI-based computer system including a chassis and a mid-plane board. The chassis houses various electrical components, and defines a front and a back. The mid-plane board is analogous to a "backplane" utilized with CompactPCI computer systems, and forms bus circuitry. The mid-plane board is positioned between the front and back of the chassis. With this in mind, the chassis and the mid-plane board combine to define a plurality of CompactPCI form factor slots, including front slots extending from the front of the chassis to the mid-plane board, and back slots extending from the back of the chassis to the mid-plane board. Further, at least one of the front slots and at least one of the back slots are system slots configured to receive and provide independent bus connections for respective CompactPCI form factor system processor cards. In one preferred embodiment, the mid-plane board is equidistantly positioned between the front and back of the chassis, establishing symmetrical front and back regions. In another preferred embodiment, respective ones of the front slots are aligned with respective ones of the back slots such that the front and back slots include aligned first slots and second slots. In other words, the chassis and mid-plane board combine to form a first front slot aligned with a first back slot, and a second front slot aligned with a second back slot. With this in mind, the mid-plane board is configured such that the first front slots provide a bussed connector, whereas the first back slot provides a transition connection to the first front slot. Conversely, the second back slot provides a bussed connector, whereas the second front slot provides a transition connection to the second back slot. With this one preferred embodiment, a one- or two-unit wide system processor card can be loaded into the first front slot, and another one- or two-unit wide system processor card can be loaded into the second back slot.

Another aspect of the present invention relates to a CompactPCI-based computer system including a chassis, a mid-plane board, a first system processor card, and a second system processor card. The chassis houses various electrical components and defines a front and a back. The mid-plane board is positioned between the front and back of the chassis and forms bus circuitry. Further, the chassis and the mid-plane board combine to define a plurality of CompactPCI form factor slots, including front slots extending from the front to the mid-plane board and back slots extending from the back of the chassis to the mid-plane board. The first system processor card is inserted within one of the front slots. Conversely, the second system processor card is inserted within one of back slots. With this in mind, the mid-plane board is configured to provide independent bus connections for each of the first and second system processor cards. In one preferred embodiment, the computer system further includes a first control panel and a second control panel. The first control panel is located on the front of the chassis and is configured to control operations of all the front and back slots. The second control panel is located on the back of the chassis and is also configured to control operation of all of the front and back slots. With this one preferred embodiment, then, control over all slots, and thus of the cards inserted therein, as provided from either the front or back of the chassis.

Yet another aspect of the present invention relates to a method of manufacturing a CompactPCI-based computer system. The method includes providing a chassis including a front and a back. A mid-plane board is also provided. The mid-plane board includes a front side, a back side, and a plurality of bussed connectors on both the front and back sides. The mid-plane board is mounted within the chassis between the front and back such that the front side faces the front of the chassis and the back side faces the back. The chassis and the mid-plane board combine to define a plurality of CompactPCI form factor slots, including front slots extending from the front of the chassis to the mid-plane board, and back slots extending from the back of the chassis to the mid-plane board. At least one of the front slots and at least one of the back slots are configured to receive and independently operate respective CompactPCI form factor system processor cards.

DESCRIPTION OF THE PREFERRED EMBODIMENTS

Figure 1:
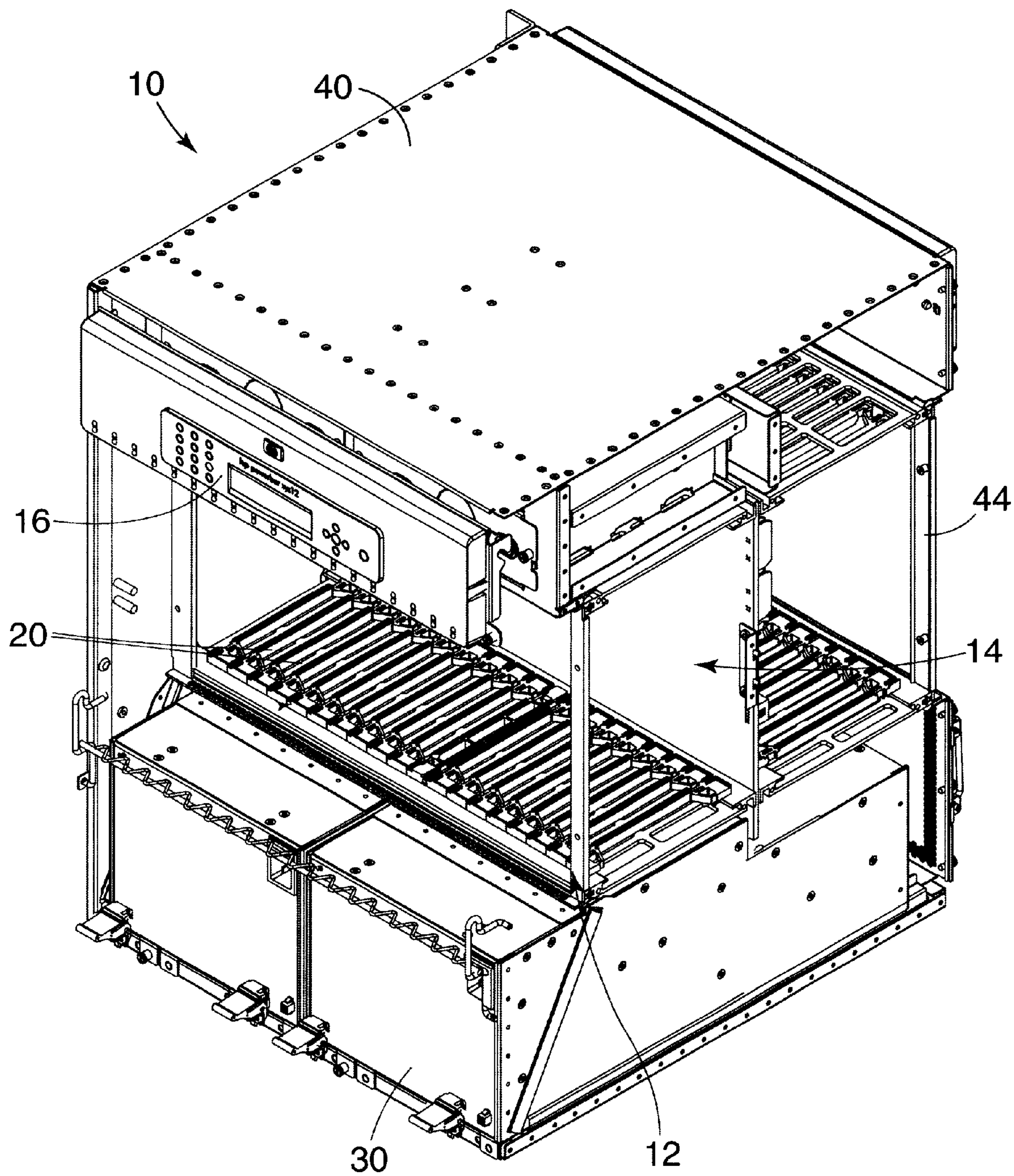
FIG. 1 is a perspective view of a computer system in accordance with the preset invention.

One preferred embodiment of a computer system 10 in accordance with the present invention is provided in FIG. 1. In general terms, the computer system 10 adheres to CompactPCI specifications, and thus can be referred to as a "CompactPCI-based computer system". In general terms, the computer system 10 includes a chassis 12, a mid-plane board 14, and first and second control panels 16 (one of which is shown in FIG. 1). The various components are described in greater detail below. In general terms, however, the mid-plane board 14 is positioned within the chassis 12. The chassis 12 and the mid-plane board 14 combine to define a plurality of slots 20 (referenced generally in FIG. 1). The control panels 16 are mounted to opposite sides of the chassis 12, respectively, and are configured to provide control over cards (not shown) otherwise loaded within the various slots 20.

As a point of reference, the computer system 10 can include a number of additional components disposed within the chassis 12. For example, with further reference to FIG. 2, in one preferred embodiment, the computer system 10 further includes a power supply unit 30, a cooling fan 32, and disk drives 34. As will be appreciated by one of ordinary skill in the art, one or more of the components 30–34 can be eliminated, and/or additional components added.

The chassis 12 provides the structural support for the computer system 10 and generally defines a top panel 40, a bottom panel 42 (shown best in FIG. 2), opposing side panels 44 (one of which is shown in FIG. 1), a front 46 and a back 48. As a point of reference, directional terminology, such as "top," "bottom," "front," "back," etc., is relative to the orientation of FIG. 1. This terminology is used for purposes of illustration only and is in no way limiting. That is to say, the computer system can be positioned in a variety of orientations other than that specifically shown in FIG. 1 such that the front 46 serves as a back, whereas the back 48 serves as a front. Regardless, the various electrical components of the computer system are housed within the chassis 12.

In one preferred embodiment, the chassis 12 is designed to accommodate a plurality of vertically oriented 6U CompactPCI formed factor cards (referenced at 50 in FIG. 2), along with the various auxiliary components. In one preferred embodiment, the chassis 12 has a depth (or distance between the front and back 46, 48) of 18 inches, a width (or distance between the opposing side panels 44) of 19 inches, and a height of approximately 13U (22.75 inches). Other dimensions, especially in terms of height and width, are also acceptable. It should be noted, however, that the preferred depth of 18 inches is greater than a standard CompactPCI chassis depth of less than approximately 17 inches.

Figure 2:
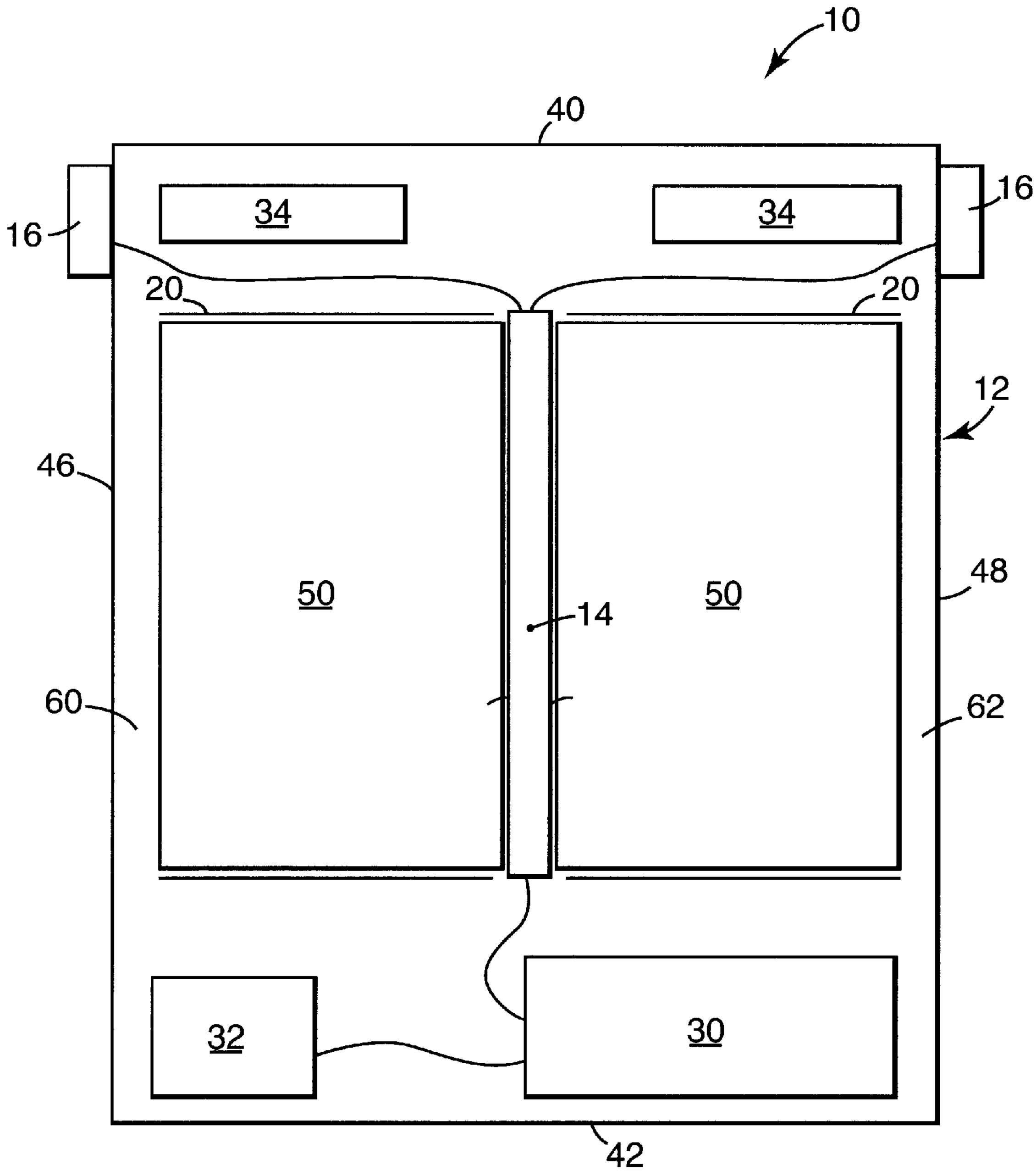
FIG. 2 is a side, diagrammatical view of the computer system of FIG. 1.

The mid-plane board 14 is similar to backplane boards typically utilized with CompactPCI computer systems in that the mid-plane board 14 provides circuitry connections for various cards connected thereto, along with bus architecture. However, as described in greater detail below, the mid-plane board 14 in accordance with the present invention provides a unique connector orientation. In addition, unlike a standard CompactPCI computer system, the mid-plane board 14 is located approximately equidistant from the front 46 and the back 48 as best shown in FIG. 2. The mid-plane board 14 effectively divides the chassis 12 into a front region 60 and a back region 62. The regions 60, 62 are substantially symmetrical, having a preferred depth of approximately 8 inches. In direct contrast to the standard CompactPCI computer system design, both of the front and back regions 60, 62 allow for the insertion of standard 6U CompactPCI form factor cards 50. As a result, the computer system 10 of the present invention has the potential to load a higher number of cards, especially system processor cards, into the chassis 12.

Figure 3:
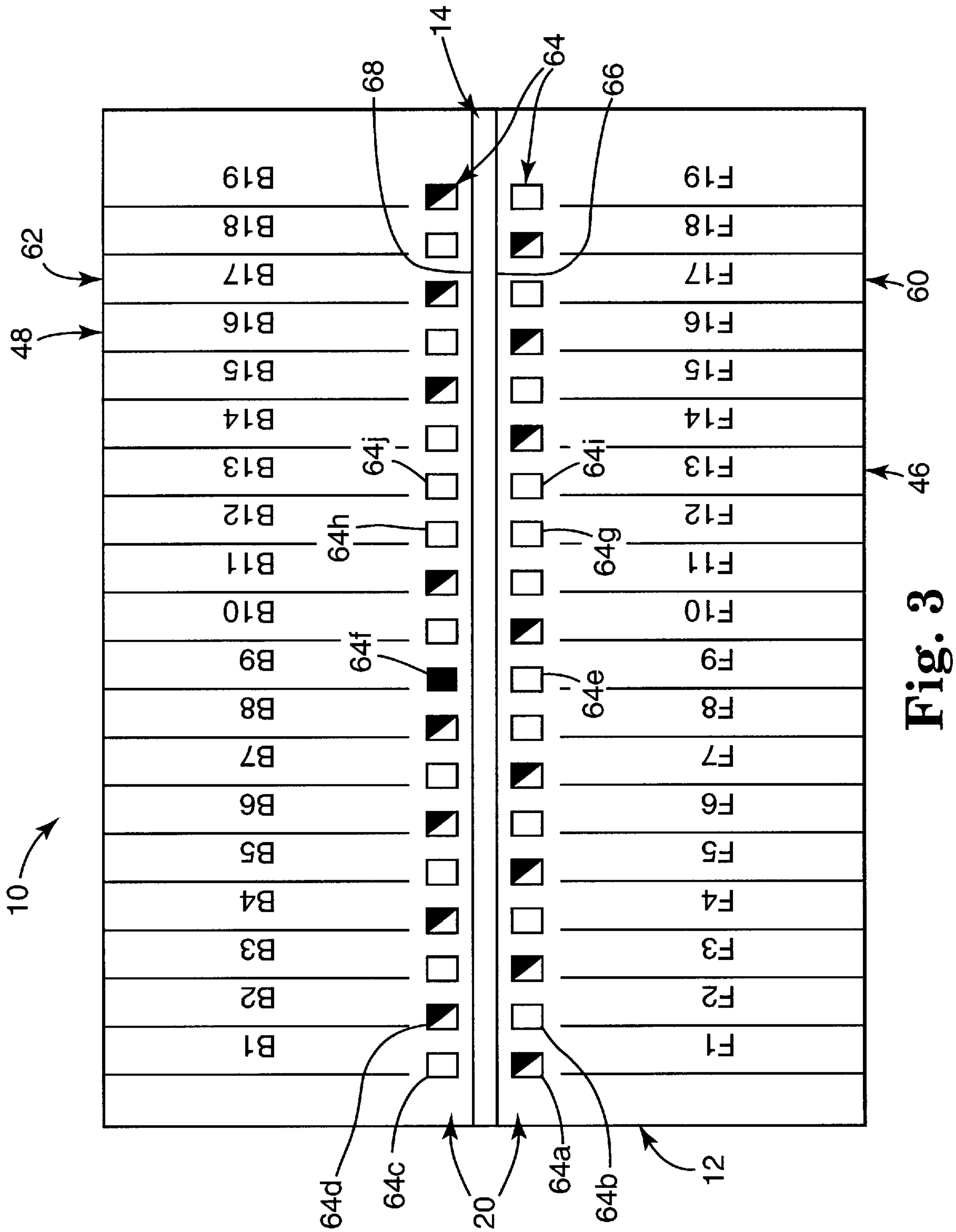
FIG. 3 is a top, diagrammatical view of a portion of the computer system of FIG. 1 illustrating a preferred slot configuration.

As previously described, the chassis 12 and the mid-plane board 14 combine to define the plurality of slots 20. FIG. 3 diagrammatically illustrates one preferred embodiment of the slots 20, along with preferred connector/architecture of the mid-plane board 14. As a general statement, the mid-plane board 14 includes an inter-system fabric that is composed of open industry standard interfaces and standard pin-out compatibility in accordance with CompactPCI specifications. Unlike accepted CompactPCI backplanes, however, the mid-plane board 14 of the present invention facilitates loading and operation of system processor cards at several of the front and back slots 20.

With the above in mind, the one preferred embodiment of FIG. 3 illustrates the chassis 12 and the mid-plane board 14 combining to define thirty-eight of the slots 20, including nineteen slots in the front region 60 and nineteen slots in the back region 62. For ease of illustration, each of the slots 20 in the front region 60 have been labeled with the prefix "F" (i.e., F1–F19), whereas each of the slots 20 and the back region 62 have been labeled with the prefix "B" (i.e., B1–B19). As shown, each of the slots 20 in the front region 60 are aligned, relative to the mid-plane board 14, with a corresponding one of the slots 20 in the back region 62. Thus, slot F1 is aligned with slot B1, slot F2 is aligned with slot B2, etc.

The mid-plane board 14 provides a number of different connectors (shown generally at 64 in FIG. 3) for receiving and operating cards (not shown) inserted into the various slots 20. In this regard, the connectors 64, and related bus architecture (where applicable), alternates from slot-to-slot. More particularly, the mid-plane board 14 defines a front side 66 and a back side 68. The front side 66 faces the front 46 of the chassis 12, whereas the back side 68 faces the back 48. The connectors 64 extend from the respective sides 66, 68. As diagrammatically illustrated in FIG. 3, the type of connector 64, and related circuitry provided by the mid-plane board 14, alternates from slot-to-slot, and from side-to-side. For example, the connector **64*a* associated with the first front slot F1 is a bussed connector, whereas the connector 64*b* associated with the second front slot F2 is a feedthrough connector extending to the corresponding second back slot B2. Conversely, the connector 64*c* associated with the first back slot B1 is a feedthrough connector extending to the first front slot F1, whereas the connector 64*d* of the second back slot B2 is a bussed connector. The connectors 64 associated with the remaining slots 20 generally follow this same connection technique, providing alternate bussed connectors (e.g., for the front slots F3, F5, F7, F10, F14, F16, and F18; and the back slots B4, B6, B8, B11, B15, B17, and B19) and feedthrough connectors (e.g., for the front slots F4, F6, F8, F11, F15, F17, F19; and the back slots B3, B5, B7, B10, B14, B16, and B18**).

It will be noted that with the one preferred embodiment of FIG. 3, the front and back slots F9, B9, F12, B12, F13, and B13 have been designated as special purpose slots for loading and, where applicable, bussing certain types of cards such as a LAN console/management card, LAN console breakout card, LAN switch card, etc. As such, the related connectors **64*e*–64*j* deviate from the above-described alternating system processor bussed connection design. Alternatively, however, these "control" slots F9, B9, F12, B12, F13, and B13 can be formatted in accordance with the other slots whereby adjacent slots alternate between bussed connector and feedthrough connector. Conversely, additional "special purpose" slots can be provided. At a minimum, however, the slots 20 include adjacent front slots (e.g., F1, F2), one of which provides a system processor bussed connector and the other a feedthrough connector, and corresponding back slots (e.g., B1, B2**) otherwise aligned with the front slots and providing opposing system processor bus connector and feedthrough connector relative to the front slots.

The above-described bussed system processor connectors (e.g., at the slots F1, B2, F3, B4, etc.) are not routed or bussed to or between others of the slots 20. That is to say, each of the system processor bussed connectors are independent of one another. As a result, a CompactPCI form factor system processor card can be loaded within any of the front or back slots 20 that otherwise provide a system processor bussed connector, and properly operated by the mid-plane board 14. This unique configuration provides the ability to load system processor cards at either or both of the front 46 and back 48 of the chassis 12, as well as to achieve a more compact loading.

Figure 4:
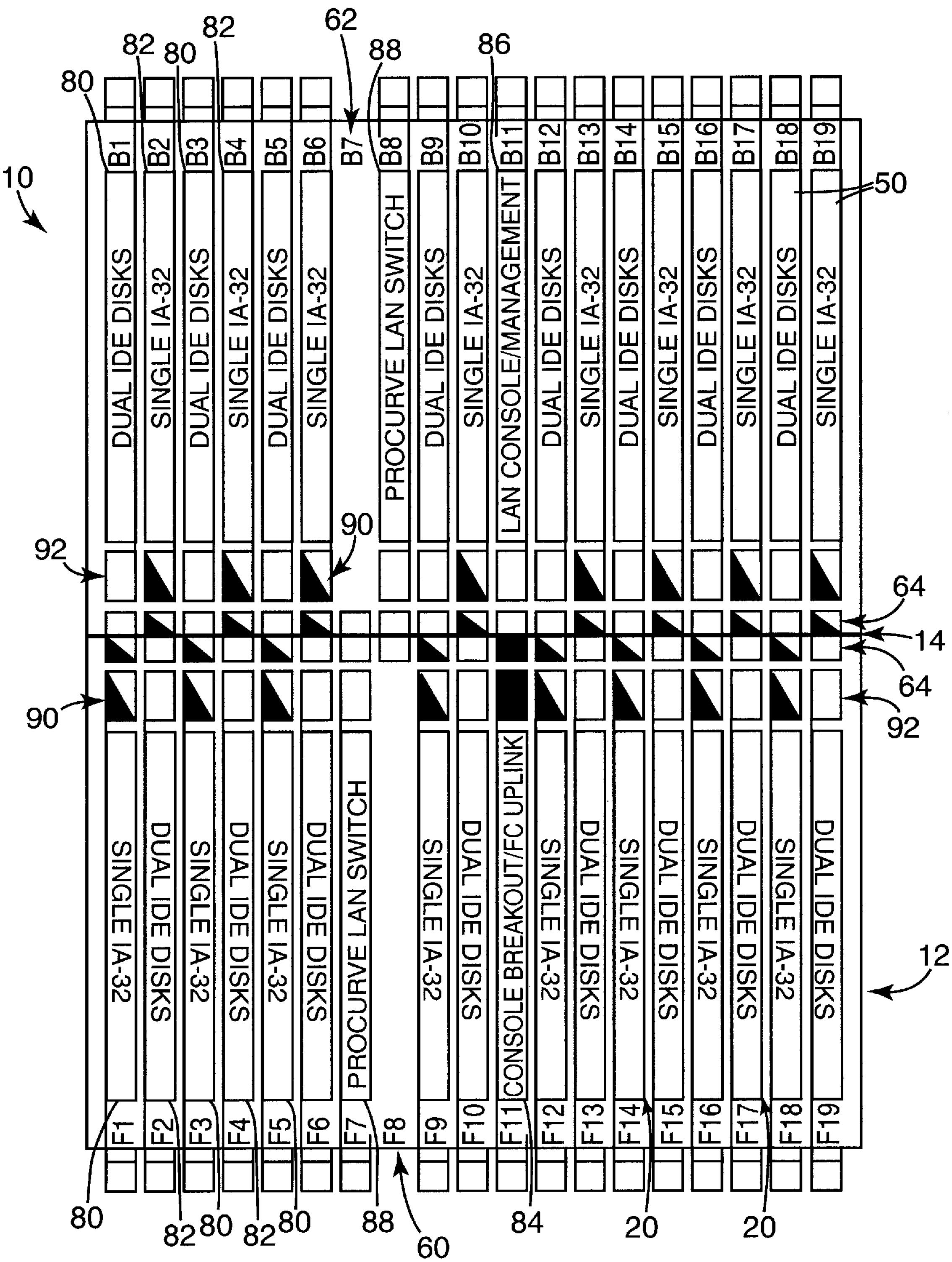
FIG. 4 is a top, diagrammatical view of the computer system of FIG. 3 loaded with cards in accordance with one embodiment of the present invention.

For example, FIG. 4 diagrammatically illustrates the computer system 10 of FIG. 3 loaded with various cards (referenced generally as 50). More particularly, the computer system 10 of FIG. 4 is loaded with system processor cards 80, disk drive cards 82, and specialty cards 84–88. Each of the system processor cards 80 and the disk drive cards 82 adhere to CompactPCI form factors, and are one-unit wide. For example, each of the system processor cards has been labeled as "single IA-32" representing an Intel Architecture, 32-bit system processor card. Of course, a wide variety of other single-unit wide system processor cards are equally applicable. The disk drive cards 82 have been labeled as "dual IDE disks", representing one type of integrated device electronic disk drive that is otherwise compatible with the particular system processor card 80. Once again, a wide variety of other single-unit wide disk drive-type cards are equally applicable. Finally, the specialty cards include the card 84 labeled as "console breakout/FC uplinks", the card 86 labeled "LAN console/management", and the cards 80 labeled "ProCurve LAN switch". These specific labels are exemplary illustrations of available system switching, management, and uplinks, and a variety of other available cards may alternatively be employed.

As illustrated by FIG. 4, the unique configuration of the chassis 12 and the mid-plane board 14 allows for a plurality of the system processor cards 80 to be loaded within the slots 20 at both the front region 60 and the back region 62 (e.g., slots F1, B2, F3, B4, F5, B6, F7, B8, F10, B11, F14, B15, F16, B17, F18, and B19). Further, each of the disk drive cards 82 is loaded opposite a corresponding one of the system processor cards 80, and connected thereto via the appropriate feedthrough connectors 64 provided by the mid-plane board 14. As a point of reference, FIG. 4 diagrammatically illustrates connection blocks for each of the cards 80–88 with the connection block 90 associated with each of the system processor cards 80 reflecting a system processor bus connection, and each of the connector blocks 92 associated with the disk drive cards 82 reflecting a feedthrough connection.

Figure 5:
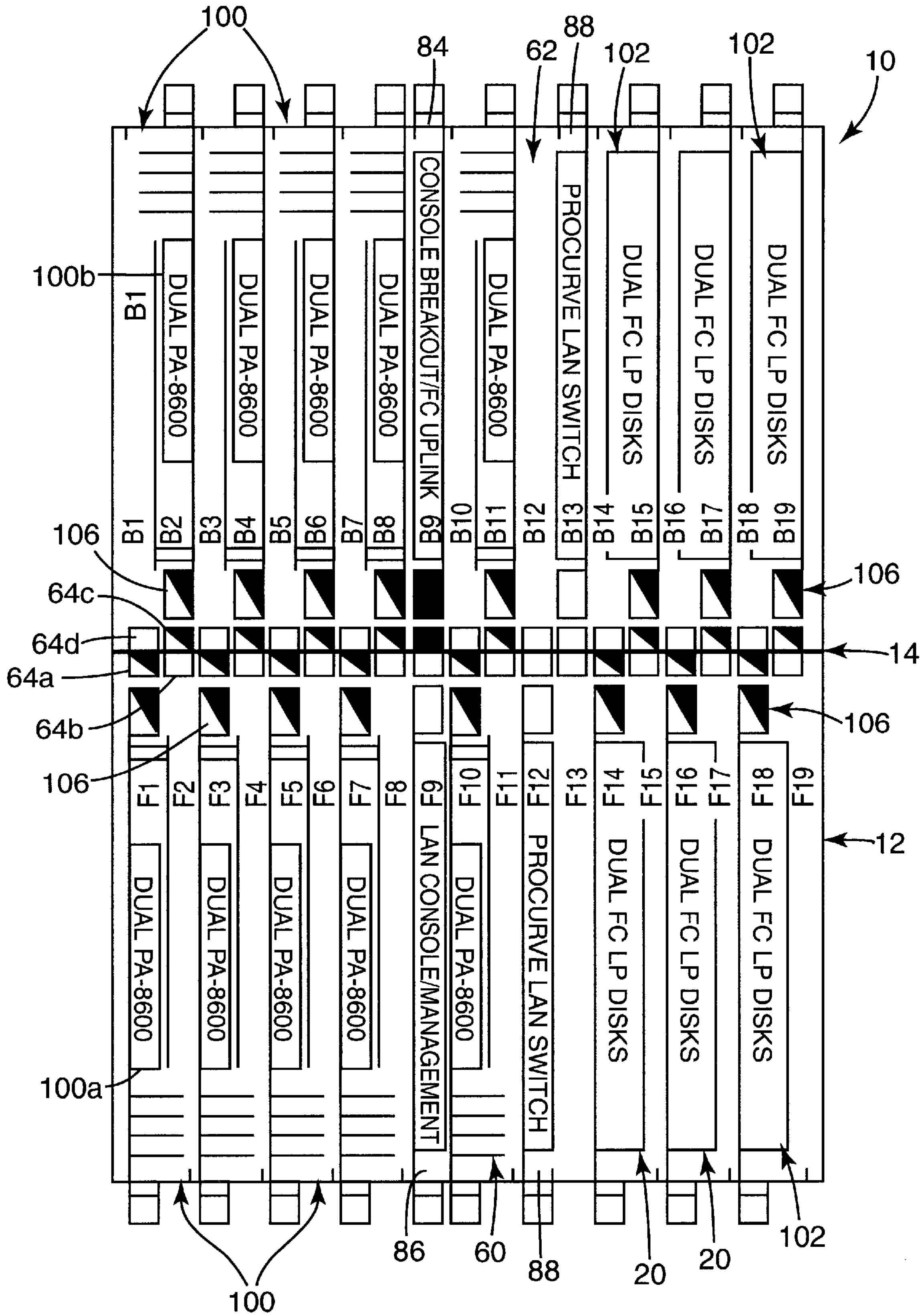
FIG. 5 is a top, diagrammatical view of the computer system of FIG. 3 loaded with cards in accordance with a second embodiment of the present invention.

The computer system 10 of the present invention further allows for loading of two-unit wide system processor cards at both the front region 60 and the back region 62. For example, FIG. 5 diagrammatically illustrates an alternative loading of the slots 20. In particular, the slots 20 are loaded with system processor cards 100, disk drive cards 102, and specialty cards 84–88. The system processor cards 100 are labeled as "Dual PA-8600", representing precision RISC (Reduced Instruction Set Computing) architecture system processor available from Hewlett-Packard. Similarly, the disk drive cards 102 are labeled "Dual FC LP disks" representing an FC (fiber channel) disk drive carrier, each having a two-unit width. Finally, the specialty cards 84–88 are, as previously described. The unique configuration of the chassis 12 and the mid-plane board 14 allows for the system processor cards 100 to be loaded at both the front region 60 and the back region 62. The design further facilitates compact arrangement of the two-unit wide system processor cards 100. For example, one of the system processor cards 100*a* is inserted into the first front slot (F1), and is connected to the bus connector 64*a*. Once again, each of the system processor cards 100 are two-unit wide, such that a portion of the system processor card 100*a* occupies two slots (e.g., F1 and F2). However, the system processor card 100*a* is not connected to the feedthrough connector 64*b*. Conversely, another of the system processor cards 100*b* is inserted into the second back slot (B2) and connected to the bussed connector 64*c*. The two-unit wide nature of the system processor card 100*b* occupies at least a portion of the first back slot (B1), but is not connected to the first back slot connector 64*d*. As illustrated by the various connection blocks 106, the system processor cards 100*a*, 100*b*, etc., are each connected to an independent system processor bus connector. The disk drive cards 102 are similarly loaded into various slots 20, each occupying two slots. Again, the disk drive cards 102 are loaded at both the front region 60 and the back region 62, and are alternately connected to corresponding bussed connectors (e.g., as provided in the slots F14, B15, F16, B17, F18, and B19). As represented by the connection blocks 106 associated with the disk drive cards 102, each of the disk drive cards 102 are routed to the FC uplink specialty card 84 for appropriate operation.

Returning to FIGS. 1 and 2, and as previously described, the computer system 10 of the present invention allows for the loading of CompactPCI form factor system processor cards at both the front 46 and the back 48 of the chassis 12. An additional feature in accordance with one preferred embodiment, is the provision of control panels 16, 18 at both the front 46 and the back 48, respectively, of the chassis 12. The control panel 16, 18 are each electrically connected to the mid-plane board 14 and afford a user the ability to control operation of all of the slots 20, and thus of the cards 50 inserted therein. Thus, an operator can service the computer system 10 from either the front 46 or the back 48 of the chassis 12. As such, where the computer system 10 is utilized in conjunction with multiple other computer systems in a racked configuration, an operator can quickly service the computer system 10 without having to walk around the series of racks to access the front as otherwise required with the standard CompactPCI chassis design.

Figure 6:
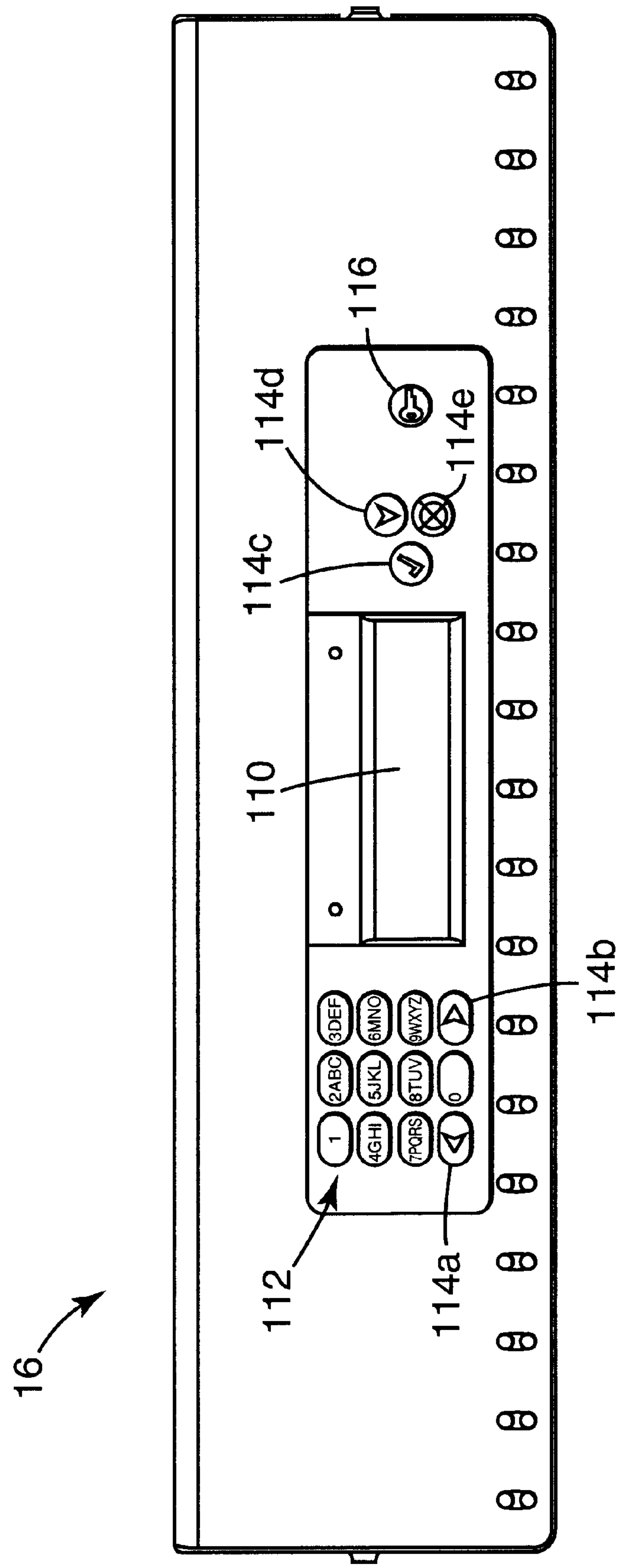
FIG. 6 is a front view of a control panel useful with the computer system of FIG. 1.

One preferred embodiment of the control panel 16, 18 is provided in FIG. 6. In one form of the invention, each of the control panels 16, 18 include a 2×20 LCD display 110, ten alphanumeric keys 112, five menu navigation/activation keys 114*a*–114*e* (collectively referred to as navigation keys 114) and a lockout key 116 with associated LED (not shown) that lights the lockout key 116. The alphanumeric keys 112 allow a user to enter alphanumeric strings that are utilized to control operation of the computer system 10. The navigation keys 114 allow a user to navigate through menus displayed on the LCD display 110, and select desired menu items. In accordance with the one most preferred embodiment, to avoid contention problems between the two control panels 16, 18 (otherwise disposed in opposite sides of the chassis 12), the lockout key 116 is provided, activation of which effectively prevents use of the other control panel 16 or 18. Thus, an operator servicing the computer system 10 via the control panel 16 can prevent another operator from unknowingly accessing the computer system 10 via the other control panel 18 by pressing the lockout key 116 on the control panel 16, 18. It will be understood that the control panel 16, 18, can assume a wide variety of other forms, and provide additional or different controlling features.

The CompactPCI-based computer system of the present invention provides a marked improvement over previous designs. In particular, as compared to the standard CompactPCI chassis design, the chassis and mid-plane board of the present invention greatly enhances the number of system processor cards that can be used, and affords loading of system processor cards from both the front and back of the chassis. Further, in one preferred embodiment, control panels are provided at both the front and back of the chassis, along with respective lockout features, facilitating servicing of the computer system from either side of the chassis.

Although the present invention has been described with respect to preferred embodiments, workers skilled in the art will recognize that changes can be made in form and detail without departing from the spirit and scope of the present invention.

What is claimed is:

1. A CompactPCI-based computer system comprising:

a chassis housing electrical components, and including a front and a back; and a mid-plane board positioned between the front and back of the chassis, and forming bus circuitry;

wherein the chassis and the mid-plane board combine to define a plurality of CompactPCI form factor slots including front slots extending from the front of the chassis to the mid-plane board and back slots extending from the back of the chassis to the mid-plane board;

and further wherein at least a first one of the front slots and at least a first one of the back slots are system slots configured to receive and provide independent bus connectors for respective CompactPCI system processor cards, and a second one of the back slots includes a feed-through connector to the first one of the front slots.

2. The computer system of claim 1, and further wherein the mid-plane board includes a front side and a back side, the front side providing a bussed connector at one of the front slots and the back side providing a bussed connector at one of the back slots.

3. The computer system of claim 1, wherein the mid-plane board divides the chassis into a front region and a back region, each of the front and back regions having a depth sufficient to receive a CompactPCI form factor system processor card.

4. The computer system of claim 3, wherein each of the front region and the back region has a depth, defined by a distance from the mid-plane board to the front and the back of the chassis, respectively, of at least 8 inches.

5. The computer system of claim 3, wherein the front region and the back region are symmetrical.

6. The computer system of claim 3, wherein the mid-plane board is equidistantly spaced from the front and back of the chassis.

7. The computer system of claim 1, wherein a plurality of the front slots and a plurality of the back slots are system processor slots configured to receive, and provide bussed connectors for, respective system processor cards.

8. The computer system of claim 1, wherein the front slots and the back slots are configured such that two adjacent front slots combine to form one of the system slots and two adjacent back slots combined to form another of the system slots such that the system slots are configured to receive and operate two-unit wide system processor cards.

9. The computer system of claim 1, wherein respective ones of the front slots are aligned with respective ones of the back slots such that the front and back slots include first slots aligned relative to the mid-plane board and second slots aligned relative to the mid-plane board, and further wherein the mid-plane board is configured such that the first front slot provides a bussed connector, the first back slot provides a feed-through connector to the first front slot, the second front slot provides a feed-through connector to the second back slot, and the second back slot provides a bussed connector.

10. The computer system of claim 9, wherein the first and second front slots are adjacent one another.

11. The computer system of claim 9, wherein the front and back slots further include third slots aligned relative to the mid-plane board and fourth slots aligned relative to the mid-plane board, and further wherein the mid-plane board is configured such that the third front slot provides a bussed connector, the third back slot provides a feed-through connector to the third front slot, the fourth front slot provides a feed-through connector to the fourth back slot, and the fourth back slot provides a bussed connector.

12. The computer system of claim 1, further comprising:

a first control panel located on the front of the chassis and configured to control operation of all the front and back slots; and a second control panel located on the back of the chassis and configured to control operation of all the front and back slots.

13. The computer system of claim 12, further comprising:

a first lock-out key located on the first control panel and configured to selectively disable the second control panel; and a second lock-out key located on the second control panel and configured to selectively disable the first control panel.

14. A CompactPCI-based computer system comprising:

a chassis housing electrical components, and including a front and a back;

a mid-plane board positioned between the front and back of the chassis, and forming bus circuitry;

wherein the chassis and the mid-plane board combine to define a plurality of CompactPCI form factor slots including front slots extending from the front of the chassis to the mid-plane board and back slots extending from the back of the chassis to the mid-plane board;

a first system processor card loaded within one of the front slots; and a second system processor card loaded within one of the back slots;

wherein the mid-plane board is configured to provide independent bus connectors and feed-through connectors for each of the first and second system processor cards.

15. The computer system of claim 14, further comprising:

a third system processor card loaded within another of the front slots; and a fourth system processor card loaded within another of the back slots;

wherein the mid-plane board is configured to provide independent bus connectors for each of the third and fourth system processor cards.

16. The computer system of claim 14, wherein each of the system processor cards has a width corresponding to a CompactPCI form factor width.

17. The computer system of claim 14, wherein each of the system processor cards has a width that is twice a CompactPCI form factor unit width.

18. The computer system of claim 17, wherein the front and back slots are aligned relative to the mid-plane board such that the front and back slots include aligned first and second slots, and further wherein the first system processor card is inserted within the first and second front slots and the second system processor card is inserted within the first and second back slots, and further wherein the mid-plane board is configured to provide a bussed connector for the first system processor card at the first front slot and a bussed connector for the second system processor card at the second back slot.

19. The computer system of claim 14, further comprising:

a first control panel located on the front of the chassis and configured to control operation of all the front and back slots; and a second control panel located on the back of the chassis and configured to control operation of all the front and back slots.

20. A method of manufacturing a CompactPCI-based computer system, the method comprising:

providing a chassis including a front and a back;

providing a mid-plane board including a front side, a back side, and a plurality of bussed connectors on both the front and back sides; and mounting the mid-plane board within the chassis, such that the front side faces the front of the chassis and the back side faces the back of the chassis;

wherein the chassis and the mid-plane board combine to define a plurality of CompactPCI form factor slots including front slots extending from the front of the chassis to the mid-plane board and back slots extending from the back of the chassis to the mid-plane board;

and further wherein at least one of the front slots and at least one of the back slots are configured to receive, independently operate and provide a feed-through connector for a CompactPCI form factor system processor card.

* * * * *